United States Patent [19]

Helke et al.

[11] Patent Number: 5,423,995

[45] Date of Patent: Jun. 13, 1995

[54] PIEZOCERAMIC MATERIAL HAVING HIGH PIEZOELECTRIC ACTIVITY AND HIGH DIELECTRIC CONSTANT

[75] Inventors: Günter Helke; Hans-Joachim Langer, both of Lauf, Germany

[73] Assignee: Hoechst Aktiengesellschaft, Frankfurt am Main, Germany

[21] Appl. No.: 208,214

[22] Filed: Mar. 10, 1994

[30] Foreign Application Priority Data

Mar. 12, 1993 [DE] Germany .................. 43 07 804.4

[51] Int. Cl.$^6$ ............... C04B 35/472; C04B 35/491; C04B 35/499
[52] U.S. Cl. ................. 252/62.9; 501/135; 501/123
[58] Field of Search ............ 252/62.9; 501/135, 123

[56] References Cited

U.S. PATENT DOCUMENTS

| | | | |
|---|---|---|---|
| 4,313,839 | 2/1982 | Fesenko et al. | 252/62.9 |
| 4,812,426 | 3/1989 | Takagi et al. | 501/136 |

FOREIGN PATENT DOCUMENTS

| | | |
|---|---|---|
| 0374378 | 6/1990 | European Pat. Off. . |
| 1554730 | 1/1969 | France . |
| 2569398 | 2/1986 | France . |
| 1646675 | 3/1972 | Germany . |
| 1312140 | 4/1973 | United Kingdom . |
| 2068355 | 8/1981 | United Kingdom . |

OTHER PUBLICATIONS

Banno, H. et al., "Piezoelectric Properties and Temperature Dependences of Resonant Frequency of WO$_3$—MnO$_2$—Modified Ceramics of Pb(Zr—Ti)O$_3$", Japanese Journal of Applied Physics, 6:954–961; (Aug., 1967).

Neorg. Mater. 26, pp. 219–220 (1990) No Month.

"Guide to Dynamic Measurements of Piezoelectric Ceramics with High Electromechanical Coupling", Die Internationale Norm IEC 483 (Aug. 1, 1976).

Primary Examiner—Mark L. Bell
Assistant Examiner—C. M. Bonner
Attorney, Agent, or Firm—Foley & Lardner

[57] ABSTRACT

The invention relates to a piezoelectric ceramic material based on lead zirconate titanate and further additives, which contains as additives complex compounds having the formula $$A(W_{\frac{1}{2}}{}^{6+}Ni_{\frac{1}{2}}{}^{3+})O_3 \text{ or } A(W_{\frac{1}{2}}{}^{6+}Ni_{\frac{1}{2}}{}^{2+})O_3$$

with A=Pb, Sr, Ba or Ca as ternary or quaternary solid solutions in an amount from 1 to 10 mol %, based on the total amount of ceramic material. The ceramic material of the invention can be advantageously used in sound or ultrasound transducers for acoustics or underwater sound applications or in actuators.

17 Claims, No Drawings

PIEZOCERAMIC MATERIAL HAVING HIGH PIEZOELECTRIC ACTIVITY AND HIGH DIELECTRIC CONSTANT

The present invention relates to a piezoelectric ceramic material based on lead zirconate titanate with further additives, which has a high dielectric constant in combination with a high electromechanical coupling coefficient.

The modification of compositions based on solid solutions of lead titanate $PbTiO_3$ and lead zirconate $PbZrO_3$, known as lead zirconate titanate $Pb(Ti, Zr)O_3$, by additions and/or substitutions to achieve specifications suited to the application of piezoceramic materials is already known. In particular, variation of the properties with the stoichiometric ratio Ti/Zr in $Pb(Ti, Zr)O_3$, the effect of the partial substitution of alkaline earth metals Ca and Sr in place of Pb, the significant effect, for example, of additions of trivalent and pentavalent ions (Bi, La; Sb, Nb, Ta) as dopants and the formation of solid solutions of the lead zirconate titanate with complex compounds which, like the lead zirconate titanate, have the perovskite crystal structure of the formula $[A^{2+}B^{4+}]O_3^{2-}$ have been described.

The additions of trivalent and pentavalent ions have made it possible to prepare piezoceramics having an increased dielectric constant, high piezoelectric activity and greater dielectric and mechanical losses and also a low coercive force. A low coercive force affects the behavior of the piezoceramic on poling in an electric d.c. field; a high residual polarization, which is an absolute prerequisite for the piezoelectric activity of the ceramic, is achieved at low field strengths.

Ceramics having a low coercive force coupled with a high residual polarization are technically also referred to as "soft" piezoceramics.

The general formula of the composition based on Pb (Ti, Zr)$O_3$ which has been modified as desired is then $$(A_1, A_2 \ldots A_n)(B_1, B_2 \ldots B_n)O_3.$$

Stoichiometry and charge neutrality are ensured by maintaining the existence conditions for complex compounds, such as $$(A_{\frac{1}{2}}^{1+}A_{\frac{1}{2}}^{3+})TiO_3, Pb(B_{\frac{1}{3}}^{2+}B_{\frac{2}{3}}^{5+})O_3,$$
$$Pb(B_{\frac{1}{2}}^{3+}B_{\frac{1}{2}}^{5+})O_3$$

$$Pb(B_{\frac{1}{3}}^{2+}B_{\frac{2}{3}}^{5+})O_3, Pb(B_{\frac{2}{3}}^{3+}B_{\frac{1}{3}}^{6+})O_3,$$
$$Pb(B_{\frac{1}{2}}^{1+}B_{\frac{1}{2}}^{5+})O_3$$

Among the great variety of possible modifications of $Pb(Ti, Zr)O_3$ by the complex compounds listed, it has been possible to prepare very effective piezoceramic materials of different specifications.

A method which has been known for some time for preparing "soft" ceramics having a high dielectric constant and high piezoelectric activity is the addition of $WO_3$ to $Pb(Ti, Zr)O_3$: The effect of the $WO_3$ addition corresponds to that of $La_2O_3$ or $Nb_2O_5$. DE-A-16 46 675 describes, for example, the effect of the addition of $Pb(Mg_{\frac{1}{3}}Nb_{\frac{2}{3}})O_3 + NiO$ to $Pb(Ti, Zr)O_3$, while the effect of the addition of $WO_3$ to $Pb(Ti, Zr)O_3$ is described in Jap. J. Appl. Phys. 61 (1967) 8.954–961.

Comparable results are also achieved with quaternary compositions, such as $Pb(Ti, Zr)O_3-Pb(Zn_{\frac{1}{3}}Nb_{\frac{2}{3}})O_3-Pb(Mg_{178} W_{\frac{1}{3}})O_3$ (Neorg. Mater. 26 (1990) 219–220).

The hitherto customary additions and substitutions for modifying $Pb(Ti, Zr)O_3$ have given, for example, piezoceramics having the following properties:

Composition (1):

$$0.97 \ Pb(Zr_{0.51}Ti_{0.49})O_3 - 0.03 \ WO_3$$

[a] $\dfrac{\epsilon_{33}^T}{\epsilon_0} = 1730$

[b] $k_p = 0.55$

Composition (2): (According to J. Amer. Ceram. Soc. 49 (1966) 11, p. 577–582)

$$Pb \ (Mg_{1/3}Nb_{2/3})_{0.375}(Ti_{0.375}Zr_{0.25})O_3 + 1.0\% \text{ by wt. NiO}$$

[a] $\dfrac{\epsilon_{33}^T}{\epsilon_o} = 1930$

[b] $k_p = 0.62$
[c] $T_S; t_S$: 1240° C.; 0.75 h

Composition (3):

$$(Pb_{0.95}Sr_{0.05})(Mg_{1/3}Nb_{2/3})_{0.375}(Ti_{0.38}Zr_{0.245})O_3$$

[a] $\dfrac{\epsilon_{33}^T}{\epsilon_0} = 3856$

[b] $k_p = 0.578$
[c] $T_S; t_S$: 1270 . . . 1290° C.; 0.75 h

With

[a] Dielectric constant in accordance with DIN IEC 483

[b] Electromechanical coupling coefficient $k_p$ in accordance with DIN IEC 483 and

[c] Sintering temperature $T_s$ and sintering time $t_s$

In the above compositions presented above, the following optimization problems arise: the modification of $Pb(Ti, Zr)O_3$ by addition of the simple oxide $WO_3$ to produce soft behavior gives a dielectric constant $<2000$ together with a relatively low electromechanical coupling coefficient $k_p \leq 0.55$, cf. composition (1).

Modification of $Pb(Ti, Zr)O_3$ within wider limits is offered by the substitution of complex compounds, which can be seen from the compositions (2) and (3). Here it is found that dielectric constants in the range from 2000 to 4000 can be achieved for piezoceramics having coupling coefficients $k_p<0.60$, although this can be realized only through high material cost (about 10% by weight of expensive $Nb_2O_5$). Furthermore, the synthesis of such piezoceramics is carried out at comparatively high sintering temperatures.

It is thus an object of the invention to provide a piezoelectric ceramic which, in addition to a high dielectric constant, at the same time also possesses a high electromechanical coupling coefficient and which can be prepared economically, i.e. which can be obtained using inexpensive additives at comparatively low sintering temperatures.

This object is achieved by a piezoelectric ceramic material of the generic type mentioned in the introduction comprising piezoceramics based on the binary solid solutions $Pb(Ti, Zr)O_3$ containing, in the form of ternary or quaternary solid solutions, further complex additives having the formula $$A(W_{\frac{1}{3}}^{6+}Ni_{\frac{2}{3}}^{3+})O_3 \text{ or } A(W_{\frac{1}{2}}^{6+}Ni_{\frac{1}{2}}^{2+})O_3$$

with A = Pb, Sr, Ba or Ca in an amount from 1 to 10 mol %, based on the total amount of ceramic material.

The surprise is that the compositions of the invention have a dielectric constant $$\frac{\epsilon_{33}^T}{\epsilon_0} > 2000$$

and an electromechanical coupling coefficient $k_p \geq 0.60$.

The inexpensive materials of the invention, which can be prepared, in particular, with a lower proportion of $Nb_2O_5$, preferably have the following particularly favorable physical properties:

$$\frac{\epsilon_{33}^T}{\epsilon_0} > 4000 \text{ and } k_p > 0.62$$

Additives which are particularly useful are:

$$(1-z) Pb(Ti_uZr_v)(Mg_{\frac{1}{3}}Nb_{\frac{2}{3}})_w O_3 - z A(W_{\frac{1}{3}}Ni_{\frac{2}{3}}) O_3.$$

$Ni^{3+}$ is particularly effective in the substituted complex compound. Compositions of the specified quaternary solid solutions can be used, depending on the type and concentration of the additives, to prepare piezoelectric ceramics at sintering temperatures $T_s$ of $\leq 1150°$ C., with a simultaneous saving of at least 25% in the cost of materials.

The piezoelectric ceramics of the invention are preferably used for sound and ultrasound transducers in acoustics and underwater sound applications and for actuators.

Embodiments of the invention will now be more particularly described by way of example, without limiting the invention thereto.

For the purposes of the examples, quaternary solid solutions of the following composition were prepared:

$$(1-z) Pb(Ti_uZr_v)(Mg_{\frac{1}{3}}Nb_{\frac{2}{3}})_w O_3 - z A(W_{\frac{1}{3}}Ni_{\frac{2}{3}})O_3,$$

in which $$u + v + w = 1 \quad u = x - 1/3w$$
$$w = 0.045 \ldots 0.45 \quad v = y - 2/3w$$
$$z = 0.01 \ldots 0.10 \quad x + y = 1$$
$$\text{with } x = 0.40 \ldots 0.60$$

EXAMPLE 1

The following compound was prepared:

$$0.97 Pb(Ti_{0.385}Zr_{0.24})(Mg_{\frac{1}{3}}Nb_{\frac{2}{3}})_{0.375}O_3 - 0.03 Pb(W_{\frac{1}{3}}Ni_{\frac{2}{3}})O_3$$

For this purpose, the metal oxide or carbonate raw materials were weighed out in amounts corresponding to the stoichiometric composition and mixed and milled in an aqueous medium in a ball mill for a period of 10 hours. The mixture was subsequently dried, calcined at a temperature of 850° C., milled to a fine powder, granulated in a spray dryer and then pressed into disk-shaped test pieces at a pressure of 100 MPa. The test pieces were then sintered to full density at the temperature specified below with a holding time of 1 hour; this gave round disks having a diameter of 10 mm and a thickness of 1 mm.

The test pieces thus prepared were metallized by firing with an applied silver screen-printing paste and poled using a voltage of 2.5 kV for a time of 5 minutes at a temperature of 100° C.; thereafter the dielectric constant at a frequency of 1 kHz and at 0.5 V, the electromechanical coupling coefficient, the mechanical quality factor and the piezoelectric coefficients were determined. The following measuring equipment was used:

Impedance analyzer HP 4194 A for measuring the capacitance (dielectric constant) and the electromechanical parameters $k_p$ and $Q_m$ by the resonator measurement method in accordance with DIN a Berlincourt meter (pseudostatic measurement method) for determining the piezoelectric coefficients $d_{33}$ and $g_{33}$ in accordance with DIN IEC 483.

The test pieces according to Example 1 gave the following measured values:

$$\text{Dielectric constant } \frac{\epsilon_{33}^T}{\epsilon_0} = 4115$$

Electromechanical coupling coefficient $k_p = 0.64$
Sintering temperature $T_s = 1250°$ C.
Piezoelectric strain-field coefficient $d_{33} = 720 \cdot 10^{-12}$ m/V
Piezoelectric field-stress coefficient $g_{33} = 19.8 \cdot 10^{-3}$ Vm/N
Mechanical quality factor $Q_m = 85$

EXAMPLE 2

Example 1 was repeated to prepare test pieces having a diameter of 10 mm and a thickness of 1 mm from the following compound:

$$0.94 Pb(Ti_{0.415}Zr_{0.46})(Mg_{\frac{1}{3}}Nb_{\frac{2}{3}})_{0.125}O_3 - 0.06 Sr(W_{\frac{1}{3}}Ni_{\frac{2}{3}})O_3$$

The following physical properties were measured on the test pieces of Example 2 by exactly the same methods as in Example 1:

$$\text{Dielectric constant } \frac{\epsilon_{33}^T}{\epsilon_0} = 2445$$

$k_p = 0.598$
$T_s = 1150°$ C.
$d_{33} = 530 \cdot 10^{-12}$ m/V
$g_{33} = 24.3 \cdot 10^{-3}$ Vm/N
$Q_m = 130$

We claim:

1. A piezoelectric ceramic material based on lead zirconate titanate and which further comprises one or more complex compounds having the general formula:

$$A(W_{\frac{1}{3}}^{6+}Ni_{\frac{2}{3}}^{3+})O_3$$

wherein A represents elements selected from the group consisting of Pb, Sr, Ba and Ca, and said one or more complex compounds are present as a ternary or quaternary solid solution in an amount from 1 to 10 mol %, calculated on the total amount of ceramic material.

2. Piezoelectric material as claimed in claim 1, wherein A represents Pb or Sr.

3. Piezoelectric material as claimed in claim 1, comprising the complex compounds in an amount from 2 to 7 mol %.

4. A sintered piezoelectric shaped part of a material as claimed in claim 1, having a $$\text{dielectric constant } \frac{\epsilon_{33}^T}{\epsilon_0} \geq 2000.$$

5. A shaped part as claimed in claim 4, having a $$\text{dielectric constant } \frac{\epsilon_{33}^T}{\epsilon_0} \geq 4000.$$

6. A shaped part as claimed in claim 4, having an electromechanical coupling coefficient $k_p \geq 0.60$.

7. A shaped part as claimed in claim 6, having an electromechanical coupling coefficient $k_p \geq 0.62$.

8. A shaped part as claimed in claim 6, which is sintered at a sintering temperature $T_s < 1200°$ C.

9. A shaped part as claimed in claim 4, having a low mechanical quality factor $Q_w$ of $\leq 150$.

10. A shaped part as claimed in claim 4 having a high piezoelectric strain-field coefficient of $\geq 500 \cdot 10^{-3}$ m/V.

11. A piezoelectric ceramic material based on lead zirconate titanate and which further comprises one or more complex compounds having the general formula:

$$A(W_{\frac{2}{3}}^{6+}Ni_{\frac{1}{3}}^{2+})O_3,$$

wherein A represents elements selected from the group consisting of Sr, Ba and Ca, and said one or more complex compounds are present as a ternary or quaternary solid solution in an amount from 1 to 10 mol %, calculated on the total amount of ceramic material.

12. Piezoelectric material as claimed in claim 11, comprising the complex compounds in an amount from 2 to 7 mol %.

13. A sintered piezoelectric shaped part of a material as claimed in claim 11, having a $$\text{dielectric constant } \frac{\epsilon_{33}^T}{\epsilon_0} \geq 2000.$$

14. A shaped part as claimed in claim 13, having a $$\text{dielectric constant } \frac{\epsilon_{33}^T}{\epsilon_0} \geq 4000.$$

15. A shaped part as claimed in claim 13, having an electromechanical coupling coefficient $k_p \geq 0.60$.

16. A shaped part as claimed in claim 15, having an electromechanical coupling coefficient $k_p \geq 0.62$.

17. A shaped part as claimed in claim 15, which is sintered at a sintering temperature $T_s < 1200°$ C.

* * * * *